United States Patent [19]

Borchert et al.

[11] 3,856,586

[45] Dec. 24, 1974

[54] METHOD FOR PRODUCING HOMOGENEOUSLY DOPED ZONES IN SEMICONDUCTOR DEVICES

[75] Inventors: Edgar Borchert; Karl-Heinz Sommer, both of Belecke, Germany

[73] Assignee: Licentia Patent-Verwaltungs-G.m.b.H., Frankfurt, Germany

[22] Filed: Sept. 10, 1973

[21] Appl. No.: 395,455

[30] Foreign Application Priority Data

Sept. 14, 1972 Germany .......................... 2244992

[52] U.S. Cl. ................ 148/186, 148/189, 148/190, 357/38

[51] Int. Cl. ............................................ H01l 7/44

[58] Field of Search ........... 148/1.5, 187, 189, 190; 317/234, 235

[56] References Cited

UNITED STATES PATENTS

| | | | |
|---|---|---|---|
| 2,954,308 | 9/1960 | Lyons | 148/1.5 |
| 3,476,993 | 11/1969 | Aldrich et al. | 317/235 |
| 3,549,434 | 12/1970 | Aven | 148/189 X |
| 3,573,115 | 3/1971 | Topas | 148/189 |
| 3,798,084 | 3/1974 | Lyons | 148/189 |

*Primary Examiner*—L. Dewayne Rutledge
*Assistant Examiner*—J. M. Davis
*Attorney, Agent, or Firm*—Spencer & Kaye

[57] ABSTRACT

A method for producing a semiconductor device in a semiconductor wafer, which is initially substantially undoped, the method including initially forming in outer areas of the semiconductor wafer the semiconductor zones necessary for creating the device, in such a manner that an interior zone of the wafer is left substantially undoped, and subsequently doping the wafer with a doping material which is only slightly soluble in the material of the semiconductor wafer and has a high diffusion speed. In this manner the interior zone is given a substantially homogeneous doping concentration.

19 Claims, 4 Drawing Figures

METHOD FOR PRODUCING HOMOGENEOUSLY DOPED ZONES IN SEMICONDUCTOR DEVICES

BACKGROUND OF THE INVENTION

The present invention relates to a method for producing homogeneously doped zones in semiconductor devices, particularly those zones which are disposed in the interior of large-area semiconductor devices.

It is known that the conductivity type of semiconductors, such as silicon, germanium or compounds of the Group III and V elements of the periodic Table, for example, can be established by doping the semiconductors with elements which form impurities, these elements being incorporated in the atom lattice of the semiconductors. Depending on whether the element forming the impurities has an excess or lack of electrons in the outer shell, of its atomic structure, these being the valence electrons, with respect to the semiconductor element, the resulting semiconductors will be given an n-type or p-type conductivity.

These so-called impurity semiconductors generally contain both acceptors, which produce the p-type conductivity, as well as donors, which produce the n-type conductivity. The donors and acceptors partially cancel one another out, so that it is substantially the difference in the concentration of the acceptors and donors, i.e., the net impurity concentration, which determines the conductivity type of the semiconductor.

In some types of semiconductor devices, for example those having a $ps_nn$, $nps_np$ or $ps_np$ structure, the n-conductive zone, $s_n$, is disposed in the interior and is generally known as the base zone. Here, $s_n$ denotes a weakly doped (high resistivity) n-conductive zone.

Such an inner base zone must have a cetain concentration of impurities in order to produce an n-type conduction in devices designed for high blocking voltages, such as diodes, thyristors and particularly controlled avalanche diodes. With such devices, it is extremely important that the impurity concentration be uniformily distributed in the base zone. It is often technically very difficult to meet these requirements for local homogeneity of the doping concentration during the production process, especially in the production of large area semiconductor components.

According to one known method for producing such semiconductor devices, the starting material, for example a semiconductor wafer of silicon, is doped for this purpose with an element such as for example phosphorus, producing n-type conductivity within the wafer, before the monocrystals are produced. The accurate setting of the donor concentration and its homogeneous distribution are effected during the production of the silicon monocrystal, for example according to the known zone drawing procedure. The net impurity concentration $N_D - N_A$ in the wafer, i.e., the difference in the concentration of donors $N_D$ and acceptors $N_A$, would be approximately $10^{13}$ to $10^{14}$ atoms per $cm^3$. The endeavor in this process is to realize as homogeneous a distribution as possible of the impurities or at least to select parts of crystals which meet this criterion as closely as possible for further processing.

The drawback in this process, however, is that inhomogeneities of impurities initially present in the n-doped starting material remain in the wafer during the further process steps and also appear in the final interior n-conductive base zone, after the outer, edge, regions have been converted by redoping into primarily p-conductive zones and also possibly locally into n-conductive regions. Such inhomogeneities of the doping in the base zone clearly impair the quality of the finished semiconductor devices.

In order to convert an element of Group IV of the Periodic Table, of which practically only silicon or germanium can be used as semiconductors for practical reasons, into a semiconductor body with n-type conductivity, elements of Group V of the Periodic Table, such as phosphorus, arsenic or antimony are usually employed in most cases.

It is also known, however, to use elements form Group VI in particular sulfur, selenium or tellurium, either individually or in combination. However, the use of the elements of Group VI as doping material generally produces difficulties because diffusion losses occur on the surface of the semiconductor wafer, due to the formation of volatile compounds between the doping material and the semiconductor material.

SUMMARY OF THE INVENTION

An object of the present invention is to provide a method for producing homogeneously doped zones in semiconductor devices.

More particularly it is an objective of the present invention to produce n-conductive or p-conductive zones which are deeply disposed in the interior of the semiconductor wafers so that they hav homogeneously distributed impurities and the homogeneity extends over areas of such extent that the process can be also especially useful in the production of large area semiconductor devices.

In accordance with the method of the present invention a proess is provided for producing such homogeneously doped zones in semiconductor wafers, particularly where such zones are disposed in the interior of large-area semiconductor devices. The semiconductor wafer is initially substantially undoped. The term "substantially undoped" here designates a wafer, or zone, which is completely undoped or so weakly doped that any doping inhomogeneities which are initially present will no longer be noticeable after a subsequent doping process.

In accordance with the method of the present invention, the outer areas of the semiconductor wafer are initially doped to form the zones required for creating the device and in such a manner that a substantially undoped inner core zone remains in the interior of the semiconductor wafer and, subsequently, the semiconductor wafer is doped with a doping material which is only slightly soluble in the semiconductor material and which diffuses at high speed.

One material that can be utilized in accordance with the method of the present invention as the second doping material is sulfur. It is known that this element, which is a member of the chalcogen group, is only poorly soluble in silicon, i.e., at a diffusion temperature of 1,100°C, its solubility is about $10^{15}$ atoms per $cm^3$, and has a diffusion coefficient of $10^{-8} cm^2/sec$ at 1,100°C, which is relatively high and exceeds th values of the diffusion coefficients of the elements of Groups III and V of the Periodic Table, which are usually used as doping substances, by several orders of magnitude.

It has surprisingly been found that the subsequent doping of core zones in the interior of semiconductor wafers with rapidly diffusing and poorly soluble doping materials, such as sulfur, selenium or zinc, can be effected without adversely influencing the preceding dopings so that it becomes possible to convert the base zone to a semiconductor of n- or p-type conductivity with the required impurity concentrations by such a subsequent diffusion process.

This doping of the inner zone can be realized because the rapidly flowing doping substances reach the inner zone very quickly, even at a relatively low diffusion temperature, due to their high diffusion coefficient and produce in this inner zone the desired conductivity type. Thus it is possible, for example, to convert a weakly doped initially p-conductive inner zone into a zone with n-type conductivity by use of a sulfur diffusion process.

On the other hand, the diffusion temperatures of the rapidly flowing doping substances can be so low that the outer zones and regions which in the prior process steps had been converted to the desired p- and n-type conductivity remain uneffected during these subsequent diffusions.

The resulting concentration of these rapidly diffusing and poorly soluble doping substances in the outer edge zones is so low due to their poor solubility that the very small quantities which do remain as a residue after the diffusion in the redoped outer edge zones will not noticeably change the properties of the higher doped zones and regions. Since, for example, the solubility of sulfur is several orders of magnitude lower than that of gallium or phorphorus, a sulfur doping in areas which are highly doped with gallium or phosphorus will not have any adverse influence on these areas.

The process of the present invention produces a higher homogeneity of the inner zone than could be achieved by previously known methods especially since a zone doped by diffusion is more homogeneous than a zone doped according to other methods. This especially applies for the case where an internal n-conductive zone is to be produced.

While in the case of previously known methods, it was not possible to avoid during fabrication, local variations in the doping concentration and in the specific resistance. these problems are eliminated by the method of the present invention. The process according to the present invention is here of particular advantage because inhomogeneities in the starting material do not remain present in the finished device and, therefore, cannot adversely influence its operation.

By preventing or eliminating such local inhomogeneities, their adverse consequences also are prevented. Consequently, no local breakthroughs will occur, for example, in the blocking operation of the device at those points where the specific resistance is too low. Also, the local appearance of the punch through effect is avoided which results, for example, in thyristors, at points having insufficient doping.

The uniform conduction of current in homogeneously doped zones permits higher current loads in the blocked state before break-through occurs in the device. Another favorable effect is that during operation, there will be no local overheating of the devices.

Finally, appropriate selection of the diffusion parameters permits the setting of the desired blocking voltage and makes it no longer necessary to match the doping of the starting material with the desired blocking voltage. Moreover, with the method of the present invention, the entire production and storage procedure is simplified since it is a further advantage that the blocking voltage values of a plurality of wafers produced during a single production process are close together.

DESCRIPTION OF THE PREFERRED EMBODIMENTS

The present invention will be described with respect to the production of a thyristor structure having an inner zone of n-type conductivity. It is desirable for such thyristors to exhibit high blocking voltages.

The starting material for such structures is provided in the form of semiconductor wafers, for example silicon wafers, which are initially very weakly p-doped. A boron doping is one type suitable for this purpose, where the resulting impurity concentration is about $3 \cdot 10^{12}$ boron atoms per $cm^3$. The impurity distribution for boron doping is by nature more homogeneous than the distribution of other doping substances, such as, for example, phosphorus, because of the somewhat more favorable distribution coefficient of boron in silicon. The boron content of the semiconductor wafer after the doping process is determined by the amount of boron which could not be removed when the silicon semiconductor is subsequently cleaned or, if necessary, the final content can be achieved by additional doping. In any event, the boron doping can be effected by any well-known process.

The concentration of these acceptors, such as boron in this example, is preferably at least 10 times less than the later introduced donor concentration. In this manner, local inhomogeneities of this acceptor doping have no noticeable adverse effect on the later donor doping aand thus do not noticeably affect the properties of the finished device.

Figure 1:
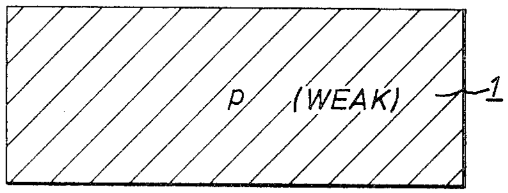
FIG. 1 is a simplified, pictorial, cross-sectional view of a semiconductor wafer.
Figure 2:
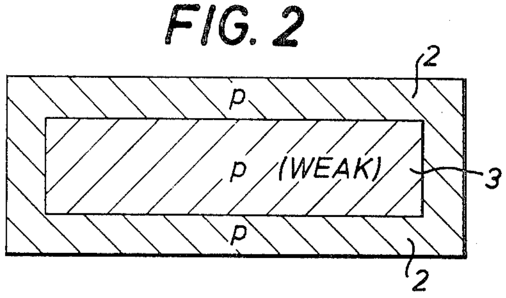
FIG. 2 is a view of the semiconductor wafer of FIG. 1 with the outer areas being doped in accordance wth the method of the present invention so as to have a p-type conductivity.

As shown in the sequence illustrated in FIGS. 1 and 2, further impurity material is initially diffused into a weakly p-doped semiconductor wafer 1 in subsequent process steps according to techniques generally known in the semiconductor art so that outer areas, i.e., outer edge zones, with higher concentrations of p-doping are produced. This can be effected in that higher p-doped edge zones 2, as shown in FIG. 2, are formed by gallium diffusion while an interior zone 3 continues to exhibit the lower p-doping of the starting material.

Figure 3:
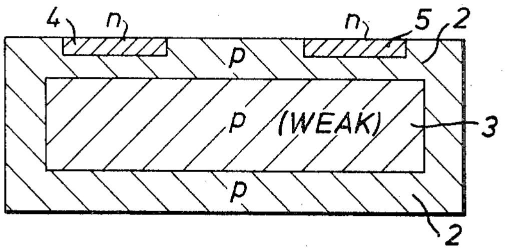
FIG. 3 is a view of the semiconductor wafer of FIG. 2 with two additional regions of an n-type conductivity formed in the outer area in accordance with the method of the present invention.

As shown in FIG. 3, within the p-doped outer edge zones, small regions 4 and 5 are then converted to n-type conductivity by a subsequent diffusion of donors, e.g., phosphorus diffusion, into these regions. If it should be necessary, the life of the minority carriers can be increased by a subsequent gettering process.

Processes for achieving these results are also abundantly well known in the art.

Figure 4:
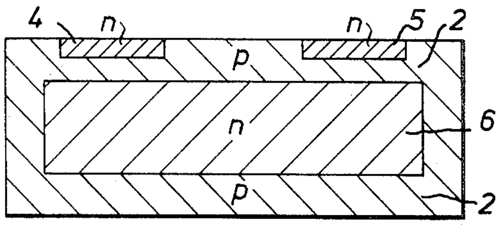
FIG. 4 is a view of the semiconductor wafer of FIG. 3 with the inner zone doped in accordance with the method of the present invention so as to have an n-type conductivity.

Sulfur is then diffused in the thus-prepared semiconductor wafer and, as shown in FIG. 4, this changes the doping of the initially p-type conductivity zone 3 into an n-type conductivity zone 6 and the donor concentration in the base zone of the thyristor is thus set to the intended value. Moreover, it has surprisingly been found that the life time of the minority carriers is not shortened in an undesirable manner by the sulfur diffusion.

It has been found to be advisable, for the sulfur diffusion, to have the wafers sealed into a quartz vessel, or vial, which is in the shape of an ampul, which vessel is then filled with a protective gas atmosphere, such as, for example, of argon. The pressure of the argon within the vessel should be about 200 torr (1 torr=1mmHg) when the filling takes place at room temperature so that the internal pressure of the vessel at the diffusion temperature will be approximately equal to the outside pressure.

As a source for doping material, a quartz boat with sulfur in its elementary form is disposed in the vessel, the sulfur having a degree of purity of about 99.999%. The quantity of the sulfur is measured so that at the diffusion temperature a partial sulfur pressure of about 10 torr will develop. This value corresponds approximately to 1.2 mg sulfur per 150 $cm^3$ of volume of the vessel.

The diffusion of the sulfur then takes place at the relatively low temperature of about 1,000°C in a known manner for a time of about 6 to 30 hours. The exact diffusion conditions are adapted to the thickness of the semiconductor wafers and the desired donor concentration and are selected accordingly. For a wafer thickness of about $540\mu$, a concentration of about $1.3 \cdot 10^{14}$ sulfur atoms per $cm^3$ is attained at the surface afer a diffusion of 8 hours at a temperature of 1,000°C, and a concentration of about $3 \cdot 10^{13}$ sulfur atoms per $cm^3$ is attained in the interior of the base zone. With the relatively low diffusion temperatures during the sulfur doping the locations of the outer edge zones 2 and of the regions 4 and 5 are not shifted. Teh very slight sulfur concentration in the regions 2, 4 and 5 still remaining therein after the diffusion has no noticeable influence on the high gallium and phosphorus doping and thus does not alter the properties of these regions.

In a corresponding manner, a p-conductive core zone with high homogeneity can be produced in the interior of a semiconductor wafer by diffusion of very rapidly diffusing and poorly soluble acceptors. In this case, however, the redoping of the initially present conductivity type can be eliminated.

Instead, it will be advisable, as in the preceding example, to begin with weakly doped p-conductive semiconductor material which already has a high homogeneity — perhaps with boron doping. With a subsequent diffusion of, for example, a Group II element such as zinc, according to the present invention, the already present p-doping is increased and set to the value required for the intended use of the device.

It has been found to be advisable, for the zinc diffusion, to have the wafers sealed into a quartz vessel, or vial, which is in the shape of an ampul, which vessel is then filled with a protective gas atmosphere, such as, for example, of argon. The pressure of the argon within the vessel should be about 200 torr when the filling takes place at room temperature so that the internal pressure of the vessel at the diffusion temperature will be approximately equal to the outside pressure.

As a source for doping material, a quartz boat with zinc in its elementary form is disposed in the vessel, the zinc having a degree of purity of about 99.999 %. The quantity of the zinc is measured so that at the diffusion temperature a partial zinc pressure of about 1 to 10 torr will develop. This corresponds approximately to a value of 0.1 to 1.2 mg zinc per 150 $cm^3$ of volume of the vessel.

The diffusion of the zinc then takes place at the relatively low temperature of about 800°to 1,000 °C in a known manner for a time of about 2 to 20 hours.

Suitable doping procedures, known in the art, which can be employed to form the various semiconductor regions in the structure illustrated in FIGS. 1–4 of the drawing are described in the U.S. Pat. No. 2,954,308 and in the U.S. Pat. No. 3,476,993.

It will be understood that the above description of the present invention is susceptible to various modifications, changes and adaptations, and the same are intended to be comprehended within the meaning and range of equivalents of the appended claims.

We claim:

1. A method for producing a semiconductor device in a semiconductor wafer which is initially substantially undoped, comprising the steps of: forming in outer areas of the semiconductor wafer the semiconductor zones necessary for creating the device while leaving an interior zone of the semiconductor wafer substantially undoped; and subsequently doping the semiconductor wafer with a doping material which is only slightly soluble in the material of the semiconductor wafer and has a high diffusion speed, for substantially homogeneously doping the interior zone.

2. A method as defined in claim 1 wherein the material of the semiconductor wafer is silicon.

3. A method as defined in claim 1 wherein the doping material for doping the interior zone is a material selected from a group consisting of sulfur, selenium, tellurium and polonium so as to form an inner zone having an n-type conductivity.

4. A method as defined in claim 3 wherein the doping material for doping the interior zone is sulfur.

5. A method as defined in claim 4 further comprising the step of initially forming a doping concentration of boron within the semiconductor wafer so that the wafer initially has a p-type conductivity.

6. A method as defined in claim 5 wherein the impurity concentration of acceptors in the interior zone, prior to said step of doping, is selected to be lower by at least a factor 10 than the donor concentration established in the interior zone by said step of doping.

7. A method as defined in claim 6 wherein the impurity concentration of such acceptors in said interior zone, prior to said step of doping, is approximately $3 \cdot 10^{12} cm^{-3}$.

8. A method as defined in claim 7 wherein said step of forming in the outer areas of the semiconductor wafer produces a higher p-doping in the outer areas than in the interior zone.

9. A method as defined in claim 8 wherein said step of forming in the outer areas of the semiconductor wafer is carried out by diffusing gallium into the outer areas of the wafer.

10. A method as defined in claim 9 wherein said step of forming further comprises doping two small regions of the outer edge zone with a further doping material so as to form zones having an n-type conductivity.

11. A method as defined in claim 10 wherein the further doping material is phosphorus.

12. A method as defined in claim 11 wherein said step of forming further comprises gettering the semiconductor wafer, before said step of subsequently doping, so as to increase the lifetime of the minority carriers in the outer edge region of the wafer.

13. A method as defined in claim 12 wherein said step of subsequently doping the semiconductor wafer is carried out inside a sealed quartz vessel.

14. A method as defined in claim 13 wherein said step of subsequently doping the semiconductor wafer is carried out in a protective gas atmosphere containing argon.

15. A method as defined in claim 14 comprising, during said step of subsequently doping of the semiconductor wafers, maintaining the pressure of the gas within the vessel, at the diffusion temperature, at approximately the same level as the external pressure.

16. A method as defined in claim 15 wherein said step of subsequently doping the semiconductor wafer with sulfur is carried out at a diffusion temperature of approximately 1,000°C.

17. A method as defined in claim 16 wherein said step of subsequently doping the semiconductor wafer with sulfur is carried out for a duration of approximately 6 to 30 hours.

18. A method as defined in claim 1 wherein the doping material for doping the interior zone is an element selected from Group II of the Periodic Table so as to form an interior zone having a p-type conductivity.

19. A method as defined in claim 18 wherein the doping material for doping the interior zone is zinc.

* * * * *